United States Patent
Shimizu et al.

(10) Patent No.: US 9,413,330 B2
(45) Date of Patent: Aug. 9, 2016

(54) ELASTIC WAVE RESONATOR INCLUDING A CONSTANT PITCH REGION WITH A TAPERING WIDTH

(71) Applicant: SKYWORKS PANASONIC FILTER SOLUTIONS JAPAN CO., LTD., Kadoma-Shi (JP)

(72) Inventors: Hidehito Shimizu, Osaka-Fu (JP); Hiroyuki Nakamura, Osaka-Fu (JP)

(73) Assignee: SKYWORKS PANASONIC FILTER SOLUTIONS JAPAN CO., LTD., Kadoma-Shi (JP)

( * ) Notice: Subject to any disclaimer, the term of this patent is extended or adjusted under 35 U.S.C. 154(b) by 127 days.

(21) Appl. No.: 14/496,207

(22) Filed: Sep. 25, 2014

(65) Prior Publication Data
US 2016/0056791 A1    Feb. 25, 2016

(30) Foreign Application Priority Data
Oct. 3, 2013    (JP) .................. 2013-208005

(51) Int. Cl.
*H03H 9/145*    (2006.01)
*H03H 9/25*    (2006.01)
*H03H 9/02*    (2006.01)

(52) U.S. Cl.
CPC .......... *H03H 9/1452* (2013.01); *H03H 9/02834* (2013.01); *H03H 9/14564* (2013.01); *H03H 9/14573* (2013.01); *H03H 9/14582* (2013.01); *H03H 9/02818* (2013.01); *H03H 9/02992* (2013.01)

(58) Field of Classification Search
CPC .......... H03H 9/02818; H03H 9/02834; H03H 9/02992; H03H 9/145; H03H 9/14517; H03H 9/1452; H03H 9/14564; H03H 9/14573; H03H 9/14582; H03H 9/25

USPC ........................ 333/196; 310/313 C
See application file for complete search history.

(56) References Cited

U.S. PATENT DOCUMENTS

| | | | | |
|---|---|---|---|---|
| 6,025,763 A * | 2/2000 | Morimoto | ............ | H03H 9/6483 310/313 C |
| 8,289,107 B2 * | 10/2012 | Mukai | .................. | H03H 9/0071 310/313 C |
| 2001/0011932 A1* | 8/2001 | Takamiya | ............ | H03H 9/6483 333/133 |
| 2002/0044497 A1* | 4/2002 | Kachi | ................ | H03H 9/02748 367/12 |
| 2009/0108960 A1 | 4/2009 | Igaki et al. | | |
| 2011/0068655 A1 | 3/2011 | Solal et al. | | |
| 2012/0161577 A1 | 6/2012 | Abbott et al. | | |
| 2013/0088305 A1* | 4/2013 | Takata | ..................... | H03H 9/64 333/133 |

FOREIGN PATENT DOCUMENTS

JP    2011-101350    5/2011
JP    2012-138964    7/2012

* cited by examiner

*Primary Examiner* — Barbara Summons
(74) *Attorney, Agent, or Firm* — Lando & Anastasi, LLP (57) ABSTRACT

An object of the present disclosure is to provide an elastic wave resonator having a high Q value, and producing little or no unwanted spurious signals. In order to achieve the object, an elastic wave resonator according to the present disclosure includes a piezoelectric substrate and an IDT electrode. The IDT electrode has an apodization-weighting portion in which a staggered section width decreases toward an end portion of the IDT electrode in an elastic wave propagation direction. The electrode finger pitch of the IDT electrode decreases toward an end portion of the IDT electrode in an end portion, in the elastic wave propagation direction, of a staggered region of the IDT electrode.

20 Claims, 8 Drawing Sheets

ELASTIC WAVE RESONATOR INCLUDING A CONSTANT PITCH REGION WITH A TAPERING WIDTH

BACKGROUND OF THE INVENTION

1. Field of the Invention

The present disclosure relates to an elastic wave resonator used in a filter or a duplexer of a mobile communication device or the like.

2. Description of the Related Art

In recent years, there has been an increasing demand for a high performance elastic wave device having excellent temperature characteristics. In order to achieve such an elastic wave device, studies have been made for use of an elastic wave resonator that has an improved temperature characteristic by using a piezoelectric substrate of lithium niobate, and by providing a silicon oxide film over an inter-digital transducer (IDT) electrode. Such an elastic wave device uses, for general purposes, a technique of apodization weighting in electrode fingers of the IDT electrode in order to reduce or eliminate spurious signals in a higher-order transverse mode. As a prior art literature relating to the present disclosure, Patent Literature (PTL) 1 has been known.

CITATION LIST

Patent Literature

PTL 1: Unexamined Japanese Patent Publication No. 2012-1389641

SUMMARY OF THE INVENTION

However, a problem exists in that an elastic wave resonator having an IDT electrode in which apodization weighting is applied to electrode fingers has a high Q value (Qp) at an antiresonance frequency, but has a low Q value (Qs) at a resonance frequency.

In view of the foregoing problem, it is an object of the present disclosure to provide an elastic wave resonator having a high Q value at a resonance frequency, and producing little or no spurious signals.

In order to achieve the above object, an elastic wave resonator according to the present disclosure includes a piezoelectric substrate and an IDT electrode. The IDT electrode has an apodization-weighting portion in which a staggered section width decreases toward an end portion of the IDT electrode in an elastic wave propagation direction. The electrode finger pitch decreases toward an end portion of the IDT electrode in an end portion, in the elastic wave propagation direction, of a staggered region of the IDT electrode.

The configuration described above can provide an elastic wave resonator having a high Q value, and producing little or no spurious signals.

DETAILED DESCRIPTION OF THE PREFERRED EMBODIMENTS

Figure 1:
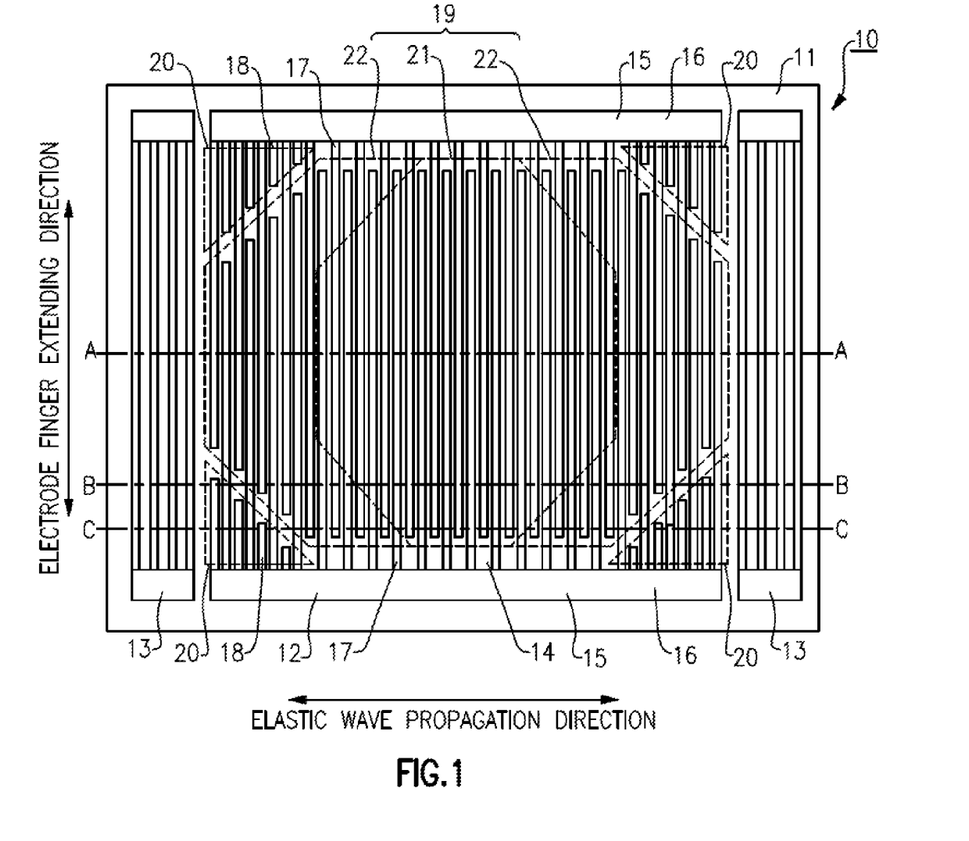
FIG. 1 is a top view schematically illustrating a configuration of an electrode of an elastic wave resonator according to one exemplary embodiment of the present disclosure.
Figure 2:
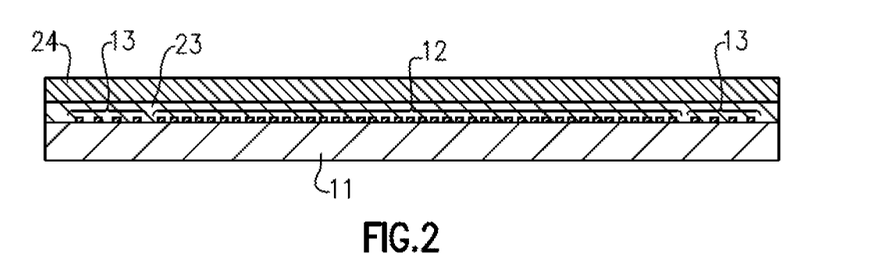
FIG. 2 is a cross-sectional view schematically illustrating a cross section of the elastic wave resonator.

FIG. 1 is a top view schematically illustrating a configuration of an electrode of an elastic wave resonator according to one exemplary embodiment of the present disclosure. FIG. 2 is a cross-sectional view schematically illustrating the elastic wave resonator.

In FIGS. 1 and 2, elastic wave resonator 10 according to one exemplary embodiment of the present disclosure is a surface acoustic wave resonator utilizing Rayleigh waves. Elastic wave resonator 10 includes piezoelectric substrate 11 made of lithium niobate, on which inter-digital transducer (IDT) electrode 12 and reflectors 13 are disposed in a direction in which an elastic wave propagates (hereinafter referred to as the "elastic wave propagation direction"). Reflectors 13 are respectively disposed on opposite sides of IDT electrode 12. IDT electrode 12 and reflectors 13 each include a stack of a molybdenum (Mo) layer and an aluminum (Al) layer.

IDT electrode 12 includes a pair of comb electrodes 15 staggered with respect to each other with gap 14 therebetween. Each of comb electrodes 15 includes bus bar 16, and staggered electrode fingers 17 and dummy electrode fingers 18 both extending from bus bar 16. Staggered electrode fingers 17 of one comb electrode 15 are disposed so as to alternate with staggered electrode fingers 17 of opposite comb electrode 15. Each of dummy electrode fingers 18 is disposed next to staggered electrode fingers 17 extending from same bus bar 16, and the end of each dummy electrode finger 18 faces the end of one of staggered electrode fingers 17 of opposite comb electrode 15 with gap 14 therebetween. The region where staggered electrode fingers 17 of one comb electrode 15 and staggered electrode fingers 17 of opposite comb electrode 15 are alternately disposed is staggered region 19, and the region where dummy electrode fingers 18 are disposed is dummy region 20.

A part of staggered electrode fingers 17 in staggered region 19 include therein a staggered section width apodization-weighting portion, in which the staggered section width in an electrode finger extending direction decreases toward an end portion in an elastic wave propagation direction. Dummy electrode fingers 18 are provided so as to face staggered electrode fingers 17 having a staggered section width apodization-weighting portion. None of dummy electrode fingers 18 are provided so as to face staggered electrode fingers 17 not having a staggered section width apodization-weighting portion.

Constant pitch region 21 is provided in a central portion of staggered region 19. In constant pitch region 21, the pitch of staggered electrode fingers 17 is substantially constant. The width of constant pitch region 21 in the electrode finger extending direction is weighted so as to decrease toward the opposite ends in the elastic wave propagation direction. In other words, the width of constant pitch region 21 in the elastic wave propagation direction decreases toward the opposite ends in the electrode finger extending direction.

Reduced pitch region 22 having a gradation pattern is provided on each side portion of staggered region 19 in the elastic wave propagation direction. In reduced pitch region 22, the pitch of staggered electrode fingers 17 gradually decreases toward an end portion in the elastic wave propagation direction. The pitch of staggered electrode fingers 17 in reduced pitch region 22 approaches the pitch of staggered electrode fingers 17 in constant pitch region 21 with decreasing distance to constant pitch region 21. Note that, although not shown, a part of staggered electrode fingers 17 in reduced pitch region 22 are not straight, but bent.

Elastic wave resonator 10 is a surface acoustic wave resonator utilizing Rayleigh waves. The waves used are not limited to Rayleigh waves, but Love waves and pseudo-elastic waves may be used. In addition to lithium niobate, piezoelectric substrate 11 may be formed of another material such as potassium niobate, lithium tantalate, quartz crystal, langasite, lithium tetraborate, or the like. Piezoelectric substrate 11 may also be configured such that piezoelectric thin films are stacked on an insulator.

IDT electrode 12 and reflectors 13 may be formed of a suitable metal or alloy. Bus bar 16 and leading wires (not shown) connected to bus bar 16 may be formed by further providing an auxiliary metal film over the stack of metal films of Mo film and Al film as described above. The auxiliary metal film may be formed using Al, Au, Ni, Ti, Cr, Pt, Cu, W, Ag, or other elements. The auxiliary metal film may include a stack of a plurality of metal films formed of these metals. The auxiliary metal film may also be formed of an alloy made primarily of one or more of these metals.

Electrically insulating dielectric film 23, made of silicon oxide, is formed over piezoelectric substrate 11 so as to cover IDT electrode 12 and reflectors 13 for improving frequency-temperature characteristic. Electrically insulating dielectric film 24, made of silicon nitride, is provided over dielectric film 23. Dielectric film 24 is preferably made of a material having a sonic velocity higher than the sonic velocity of dielectric film 23. This material is not limited to silicon nitride, and may also be aluminum nitride. A passivation film (not shown), made of silicon oxide, silicon nitride, aluminum oxide, or the like, may be further provided over dielectric film 24.

Figure 3A:
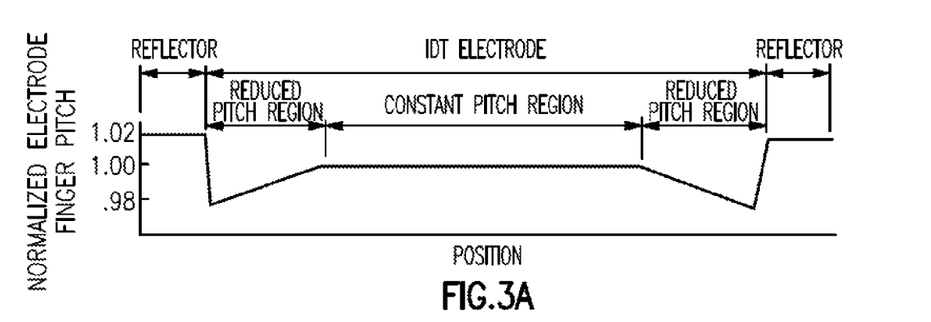
FIG. 3A is a diagram illustrating distribution profiles of a normalized electrode finger pitch along line A-A of the elastic wave resonator shown in FIG. 1.
Figure 3B:
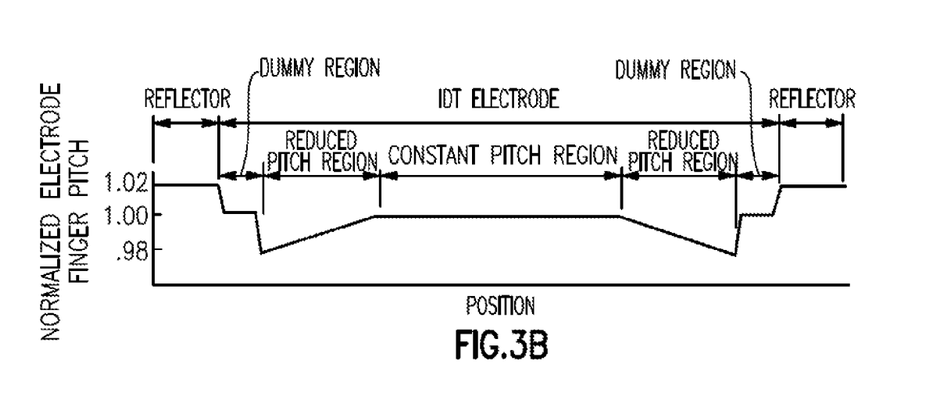
FIG. 3B is a diagram illustrating distribution profiles of a normalized electrode finger pitch along B-B of the elastic wave resonator shown in FIG. 1.
Figure 3C:
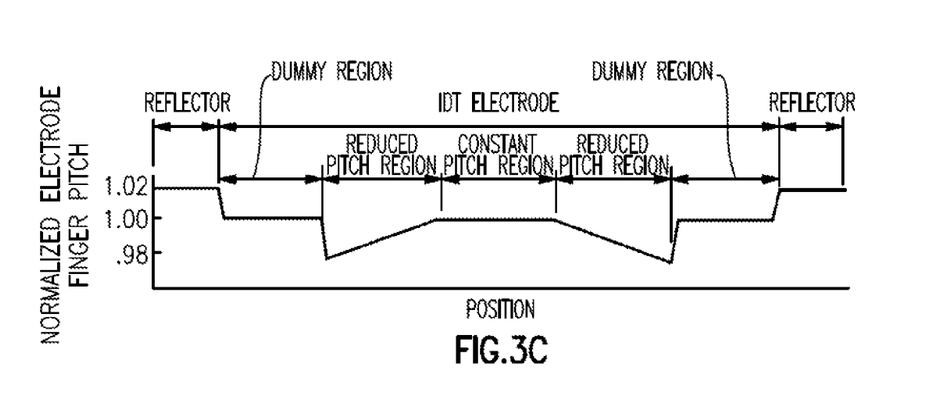
FIG. 3C is a diagram illustrating distribution profiles of a normalized electrode finger pitch along line C-C of the elastic wave resonator shown in FIG. 1.

FIGS. 3A to 3C are diagrams illustrating distribution profiles of a normalized electrode finger pitch along line A-A to line C-C, respectively, of elastic wave resonator 10 according to one exemplary embodiment of the present disclosure.

As used herein, the term "pitch" refers to a distance between centers of two adjacent electrode fingers 17 among the plurality of staggered electrode fingers 17 extending from same bus bar 16. A pitch in reflectors 13 refers to a distance between centers of two adjacent electrode fingers among the electrode fingers included in reflectors 13.

FIG. 3A is a diagram illustrating a distribution profile of the electrode finger pitch along line A-A of FIG. 1. If the pitch of staggered electrode fingers 17 in constant pitch region 21 of IDT electrode 12 is normalized to 1, the pitch of staggered electrode fingers 17 in each end of IDT electrode 12 in the elastic wave propagation direction is 0.98. In reduced pitch region 22 of IDT electrode 12, the pitch of staggered electrode fingers 17 changes from 0.98 to 1. The electrode finger pitch in reflectors 13 is 1.02.

FIG. 3B is a diagram illustrating a distribution profile of the electrode finger pitch along line B-B of FIG. 1. On line B-B, dummy electrode fingers 18 exist in the opposite ends of IDT electrode 12 in the elastic wave propagation direction. Dummy electrode fingers 18 are not disposed next to staggered electrode fingers 17 extending from opposite bus bar 16. If the pitch of staggered electrode fingers 17 in a central portion of IDT electrode 12 in the elastic wave propagation direction is normalized to 1, the pitch of dummy electrode fingers 18 in dummy region 20 provided in each end of IDT electrode 12 in the elastic wave propagation direction is 1. Reduced pitch region 22 exists in each end portion of staggered region 19, and the pitch of staggered electrode fingers 17 at the outer end of reduced pitch region 22 is 0.98. Thus, the pitch of staggered electrode fingers 17 changes from 0.98 to 1 in reduced pitch region 22. The electrode finger pitch in reflectors 13 is 1.02.

FIG. 3C is a diagram illustrating a distribution profile of the electrode finger pitch along line C-C of FIG. 1. On line C-C, dummy region 20 is wider than dummy region 20 on line B-B in each end portion of IDT electrode 12 in the elastic wave propagation direction. In dummy region 20, staggered electrode fingers 17 extending from one bus bar 16 and staggered electrode fingers 17 extending from opposite bus bar 16 are not disposed next to each other. If the pitch of staggered electrode fingers 17 in a central portion of IDT electrode 12 in the elastic wave propagation direction is normalized to 1, the pitch of dummy electrode fingers 18 in dummy region 20 provided in each end of IDT electrode 12 in the elastic wave propagation direction is 1. Reduced pitch region 22 exists in each end portion of staggered region 19, and the pitch of staggered electrode fingers 17 at the outer end of reduced pitch region 22 is 0.98. Thus, the pitch of staggered electrode fingers 17 changes from 0.98 to 1 in reduced pitch region 22. The electrode finger pitch in reflectors 13 is 1.02.

Note that, as is obvious from FIGS. 3A to 3C, the width of constant pitch region 21 in the elastic wave propagation direction decreases in a direction from line A-A to line C-C. That is to say, in staggered region 19, the width of constant pitch region 21 decreases in both directions from a central portion to the opposite ends (i.e., bus bars 16) in the electrode finger extending direction.

The number of staggered electrode fingers 17 in IDT electrode 12 preferably ranges from 80 to 180. The number of staggered electrode fingers 17 in reduced pitch region 22 preferably ranges from 3 to 25. The pitch of staggered electrode fingers 17 in reduced pitch region 22 does not necessarily need to monotonically increase or monotonically decrease. All that is required is that staggered electrode fingers 17 have two or more pitches, and that the average pitch of staggered electrode fingers 17 in reduced pitch region 22 is less than the pitch of staggered electrode fingers 17 in constant pitch region 21. The electrode finger pitch in reflectors 13 does not necessarily need to be constant, but it is preferable that the average pitch of the electrode fingers in reflectors 13 be greater than the average pitch of staggered electrode fingers 17 in IDT electrode 12. The number of the electrode fingers in reflectors 13 is preferably greater than or equal to 10.

The configuration described above can provide an elastic wave resonator having a high Q value, and producing little or no spurious signals.

Figure 4:
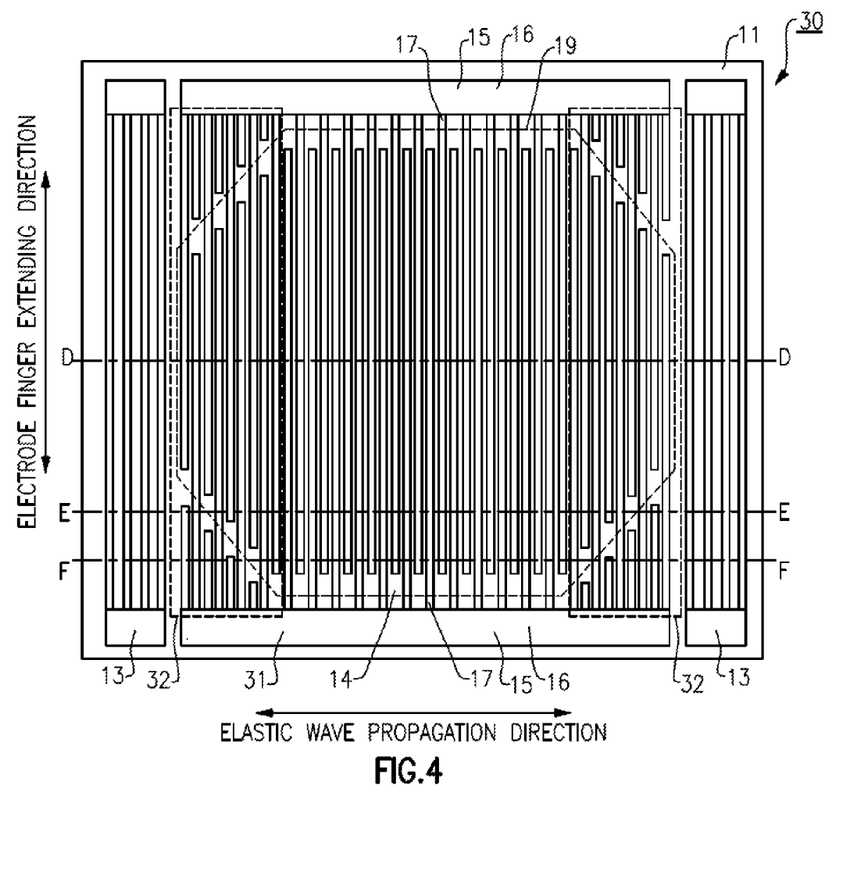
FIG. 4 is a top view schematically illustrating a configuration of an electrode of an elastic wave resonator of a comparative example.

FIG. 4 illustrates elastic wave resonator 30 of a comparative example. In elastic wave resonator 30 of the comparative example, the same reference characters indicate components identical or equivalent to those of elastic wave resonator 10 according to one exemplary embodiment of the present disclosure, and the explanation thereof will be omitted. Elastic wave resonator 30 of the comparative example differs from elastic wave resonator 10 according to one exemplary embodiment of the present disclosure in that each of side end portions 32, enclosed by long-dashed lines, of IDT electrode 31 has an apodization-weighting portion, in which the staggered section width of staggered electrode fingers 17 gradually decreases toward the end portion in the elastic wave propagation direction, and in which the pitches of dummy electrode fingers 18 and of staggered electrode fingers 17 gradually decrease toward the end portion in the elastic wave propagation direction to form a gradation region. As used herein, the term "pitch" refers to a distance between centers of two adjacent electrode fingers 17 among the plurality of staggered electrode fingers 17 extending from same bus bar 16. A pitch in reflectors 13 refers to a distance between centers of two adjacent electrode fingers among the electrode fingers included in reflectors 13.

Figure 5A:
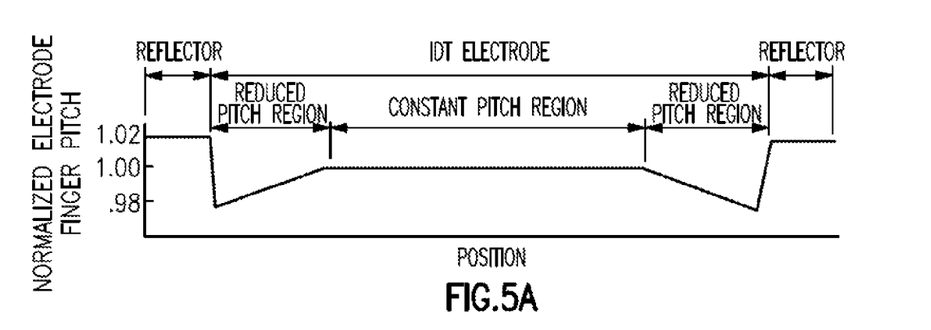
FIG. 5A is a diagram illustrating distribution profiles of a normalized electrode finger pitch along line D-D of the elastic wave resonator shown in FIG. 4.
Figure 5B:
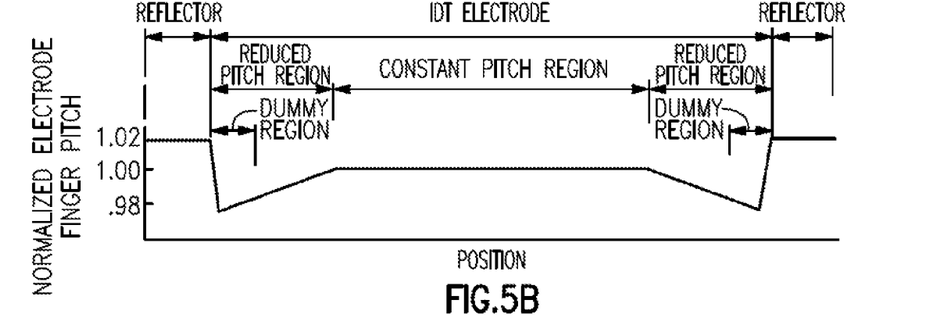
FIG. 5B is a diagram illustrating distribution profiles of a normalized electrode finger pitch along line E-E of the elastic wave resonator shown in FIG. 4.
Figure 5C:
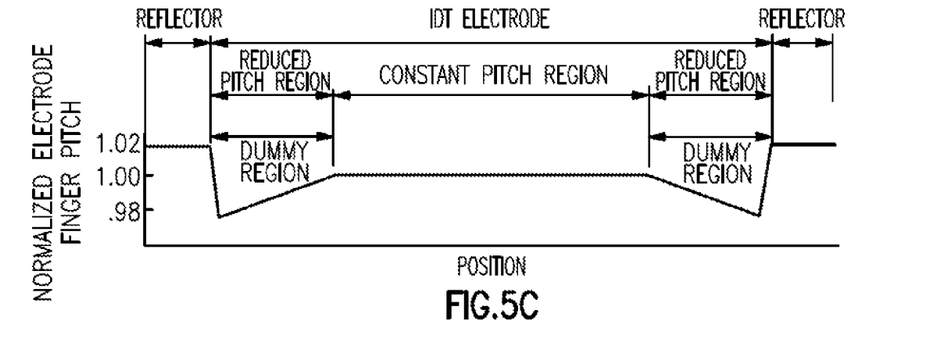
FIG. 5C is a diagram illustrating distribution profiles of a normalized electrode finger pitch along line F-F of the elastic wave resonator shown in FIG. 4.

FIGS. 5A to 5C are diagrams illustrating distribution profiles of a normalized electrode finger pitch along line D-D to line F-F, respectively, of elastic wave resonator 30 of the comparative example.

As shown in FIGS. 5A to 5C, in elastic wave resonator 30 of the comparative example, if the pitch of staggered electrode fingers 17 in a central portion of staggered region 19 in the elastic wave propagation direction is normalized to 1, the pitch of staggered electrode fingers 17 provided in each end of IDT electrode 31 in the elastic wave propagation direction is 0.98. Moreover, the pitch of staggered electrode fingers 17 and the pitch of dummy electrode fingers 18 are the same in side end portion 32 in the electrode finger extending direction irrespective of whether in staggered region 19 or in a dummy region. That is to say, the width of constant pitch region 21 in the elastic wave propagation direction remains the same on line D-D, on line E-E, and on line F-F. Elastic wave resonator 30 of the comparative example differs in this respect from elastic wave resonator 10 according to one exemplary embodiment of the present disclosure.

Figure 6:
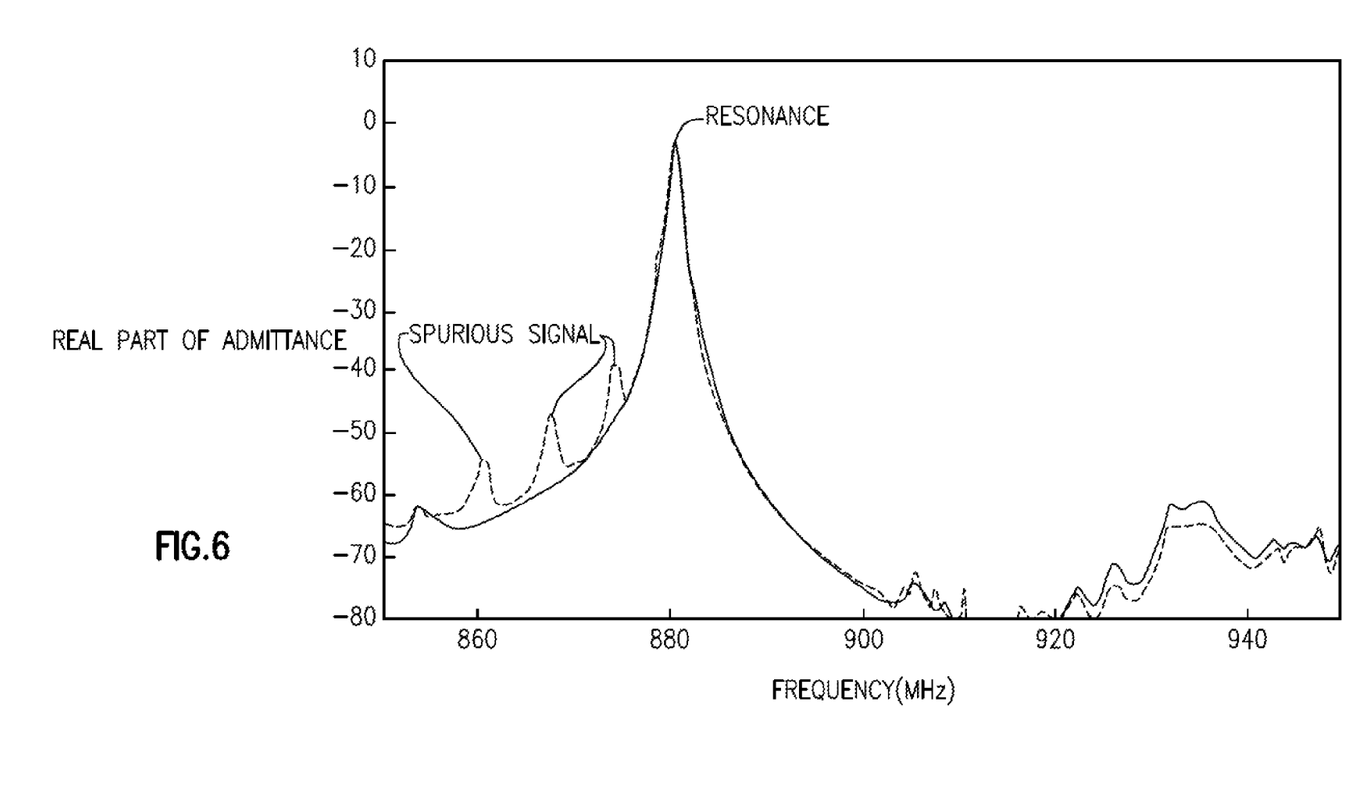
FIG. 6 is a diagram illustrating electrical characteristics of the elastic wave resonator according to one exemplary embodiment of the present disclosure and of the elastic wave resonator of the comparative example.

FIG. 6 illustrates a comparison result on electrical characteristics of elastic wave resonator 30 of the comparative example and of elastic wave resonator 10 according to one exemplary embodiment of the present disclosure. In FIG. 6, the broken line represents the real part of an admittance characteristic of elastic wave resonator 30 of the comparative example, and the solid line represents the real part of an admittance characteristic of elastic wave resonator 10 according to one exemplary embodiment of the present disclosure. As shown in FIG. 6, elastic wave resonator 30 of the comparative example generates spurious signals at frequencies below the resonance frequency. In contrast, elastic wave resonator 10 of the present disclosure generates substantially no spurious signals at frequencies below the resonance frequency, and also achieves a good Q value at the resonance frequency.

Note here that elastic wave resonator 10 according to one exemplary embodiment of the present disclosure provides this advantage even when dielectric films 23 and 24 are not provided over IDT electrode 12.

Figure 7:
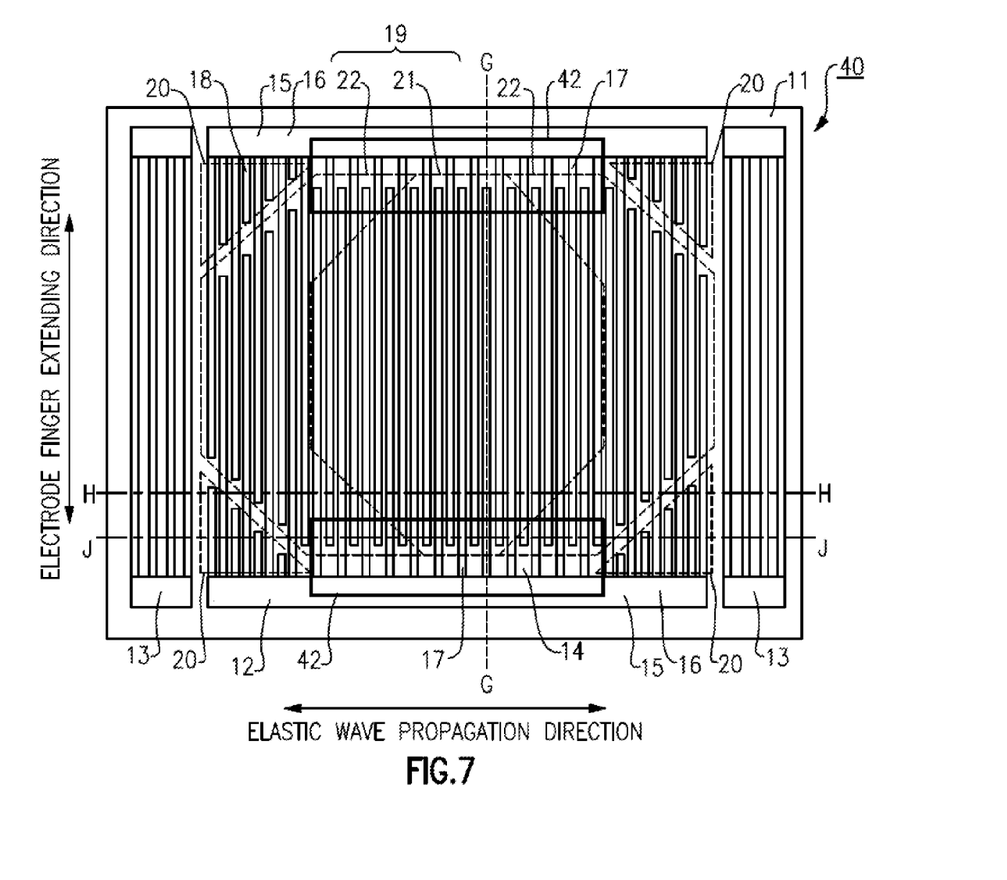
FIG. 7 is a top view schematically illustrating a configuration of an electrode of an elastic wave resonator according to another exemplary embodiment of the present disclosure.
Figure 8A:
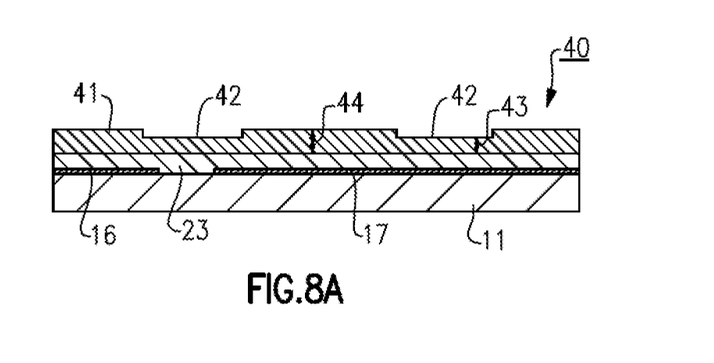
FIG. 8A is a cross-sectional view schematically illustrating a cross section taken along line G-G of the elastic wave resonator shown in FIG. 7.
Figure 8B:
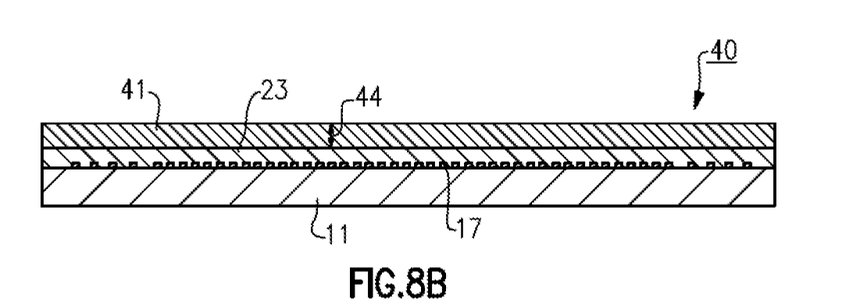
FIG. 8B is a cross-sectional view schematically illustrating a cross section taken along line H-H of the elastic wave resonator shown in FIG. 7.
Figure 8C:
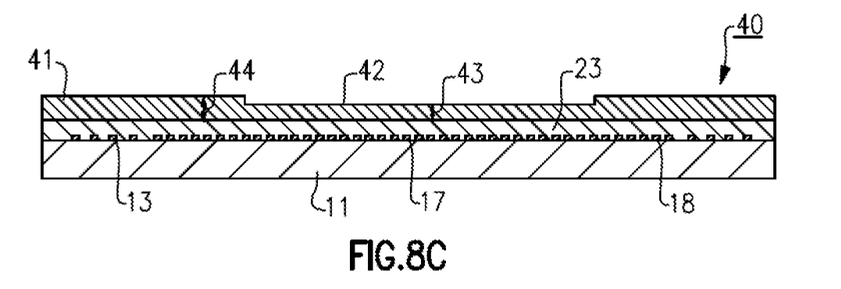
FIG. 8C is a cross-sectional view schematically illustrating a cross section taken along line J-J of the elastic wave resonator shown in FIG. 7.

FIGS. 7 and 8A to 8C illustrate elastic wave resonator 40 according to another exemplary embodiment of the present disclosure. FIG. 7 is a top view, and FIGS. 8A to 8C are cross-sectional views, schematically illustrating a configuration of an electrode of elastic wave resonator 40 according to another exemplary embodiment of the present disclosure.

In elastic wave resonator 40 according to another exemplary embodiment, the same reference characters indicate components identical or equivalent to those of elastic wave resonator 10 according to one exemplary embodiment of the present disclosure, and the explanation thereof will be omitted. Elastic wave resonator 40 according to another exemplary embodiment differs from elastic wave resonator 10 according to one exemplary embodiment of the present disclosure in that dielectric film 41 covering dielectric film 23 includes recess 42, which forms thin film portion 43 in dielectric film 41, and that the portion other than recess 42 is thick film portion Thin film portion 43 is provided in a portion of dielectric film 41 that covers end portions of staggered electrode fingers 17 of IDT electrode 12. Thin film portion 43 does not necessarily need to be provided above the end portions of all of staggered electrode fingers 17. In fact, it is preferred that thick film portion 44 exist above the end portions of staggered electrode fingers 17 in a region having a smaller staggered section width where a staggered section width apodization-weighting portion is provided. This configuration can reduce or eliminate spurious signals in a transverse mode in elastic wave resonator 40 according to another exemplary embodiment of the present disclosure.

Note that dielectric film 41 may include a stack of a plurality of dielectric films. In addition, thin film portion 43 and thick film portion 44 may have different layer configurations.

An elastic wave resonator of the present disclosure can provide an excellent resonance characteristic in which Q value is high at a resonance frequency, and spurious signals are reduced or eliminated, and is therefore useful for a filter and a duplexer.

What is claimed is:

1. An elastic wave resonator comprising:
a piezoelectric substrate; and
an inter-digital transducer (IDT) electrode provided on the piezoelectric substrate,
the IDT electrode having a staggered region in which electrode fingers of a comb electrode alternate with electrode fingers of an opposite comb electrode, the staggered region having a width in an electrode finger extending direction that tapers toward an end portion of the staggered region in an elastic wave propagation direction, the staggered region including, in a central portion, a constant pitch region in which an electrode finger pitch is substantially constant, and, on outer sides of the constant pitch region, reduced pitch regions in which an electrode finger pitch is less than the electrode finger pitch in the constant pitch region, a width of the constant pitch region in the electrode finger extending direction tapering toward an end portion of the constant pitch region in the elastic wave propagation direction.

2. The elastic wave resonator of claim 1, wherein the electrode finger pitch of the reduced pitch regions become closer to the electrode finger pitch of the constant pitch region along directions in the reduced pitch regions approaching the constant pitch region.

3. The elastic wave resonator of claim 1, wherein the IDT electrode includes dummy electrode fingers, each dummy electrode finger having an end which faces an end of an electrode finger across a gap, the dummy electrode fingers facing electrode fingers in a portion of the staggered region which tapers toward the end portion of the staggered region, none of the dummy electrode fingers facing electrode fingers not in the portion of the staggered region which tapers toward the end portion of the staggered region.

4. The elastic wave resonator of claim 1 wherein reflector electrodes are provided on both outer sides of the IDT electrode in the elastic wave propagation direction, an average pitch of electrode fingers of the reflector electrodes being greater than an average pitch of the electrode fingers of the IDT electrode.

5. The elastic wave resonator of claim 1 further comprising a first dielectric material covering the IDT electrode above the piezoelectric substrate and a second dielectric material having a sonic velocity higher than a sonic velocity of the first dielectric material covering the first dielectric material, the second dielectric material including a thin film portion and a thick film portion, the thin film portion of the second dielectric material provided above end portions of electrode fingers not in a portion of the staggered region which tapers toward the end portion of the staggered region.

6. The elastic wave resonator of claim 5, wherein the second dielectric material includes a stack of a plurality of films.

7. The elastic wave resonator of claim 1 wherein a width of the constant pitch region in the elastic wave propagation direction tapers toward an end of the constant pitch region in an electrode finger extending direction.

8. The elastic wave resonator of claim 1 wherein widths of the reduced pitch regions in the electrode finger extending direction taper toward ends of the reduced pitch regions in the elastic wave propagation direction.

9. The elastic wave resonator of claim 1 wherein widths of the reduced pitch regions in the elastic wave propagation direction taper toward ends of the reduced pitch regions in the electrode finger extending direction.

10. The elastic wave resonator of claim 1 wherein an average electrode finger pitch in the reduced pitch regions is less than an average electrode finger pitch in the constant pitch region.

11. An elastic wave resonator comprising:
a piezoelectric substrate; and
an inter-digital transducer (IDT) electrode provided on the piezoelectric substrate,
the IDT electrode having a staggered region in which electrode fingers of a comb electrode alternate with electrode fingers of an opposite comb electrode, the staggered region having a width in an electrode finger extending direction that tapers toward an end portion of the staggered region in an elastic wave propagation direction, the staggered region including, in a central portion, a constant pitch region in which an electrode finger pitch is substantially constant, and, on outer sides of the constant pitch region, reduced pitch regions in which an electrode finger pitch is less than the electrode finger pitch in the constant pitch region, a width of the constant pitch region in the elastic wave propagation direction tapering toward an end portion of the constant pitch region in an electrode finger extending direction.

12. The elastic wave resonator of claim 11 wherein a width of the constant pitch region in the electrode finger extending direction tapers toward an end portion of the constant pitch region in the elastic wave propagation direction.

13. The elastic wave resonator of claim 11 wherein a width of the reduced pitch region in the electrode finger extending direction tapers toward ends of the reduced pitch regions in the elastic wave propagation direction.

14. The elastic wave resonator of claim 11 wherein widths of the reduced pitch regions in the elastic wave propagation direction taper toward ends of the reduced pitch regions in the electrode finger extending direction.

15. The elastic wave resonator of claim 11 wherein electrode fingers in the reduced pitch regions are bent.

16. The elastic wave resonator of claim 11 wherein reflector electrodes are provided on both outer sides of the IDT electrode in the elastic wave propagation direction, an average pitch of electrode fingers of the reflector electrodes being greater than an average pitch of the electrode fingers of the IDT electrode.

17. The elastic wave resonator of claim 11 wherein the electrode finger pitch in the reduced pitch regions decrease in the elastic wave propagation direction from 100% of the electrode finger pitch in the constant pitch region to 98% of the electrode finger pitch in the constant pitch region.

18. The elastic wave resonator of claim 11 wherein an average electrode finger pitch in the reduced pitch regions is less than an average electrode finger pitch in the constant pitch region.

19. The elastic wave resonator of claim 11 including a first dielectric material covering the IDT electrode and a second dielectric material having a sonic velocity higher than a sonic velocity of the first dielectric material covering the first dielectric material, the second dielectric material including thick portions and thin portions, the thin portions provided in regions covering end portions of electrode fingers in the staggered region.

20. The elastic wave resonator of claim 19 wherein thick portions of the second dielectric material are provided over end portions of electrode fingers in a portion of the staggered region having the width in the electrode finger extending direction that tapers toward the end portion of the staggered section in the elastic wave propagation direction.

* * * * *